US010736237B2

(12) United States Patent
Xu et al.

(10) Patent No.: US 10,736,237 B2
(45) Date of Patent: Aug. 4, 2020

(54) HEAT SINK, PREPARATION METHOD THEREFOR, AND COMMUNICATIONS DEVICE

(71) Applicant: HUAWEI TECHNOLOGIES CO., LTD., Shenzhen, Guangdong (CN)

(72) Inventors: Yan Xu, Yokohama (JP); Linfang Jin, Shenzhen (CN)

(73) Assignee: HUAWEI TECHNOLOGIES CO., LTD., Shenzhen, Guangdong (CN)

(*) Notice: Subject to any disclaimer, the term of this patent is extended or adjusted under 35 U.S.C. 154(b) by 76 days.

(21) Appl. No.: 16/175,703

(22) Filed: Oct. 30, 2018

(65) Prior Publication Data
US 2019/0075683 A1    Mar. 7, 2019

Related U.S. Application Data

(63) Continuation of application No. PCT/CN2017/100551, filed on Sep. 5, 2017.

(30) Foreign Application Priority Data

Sep. 13, 2016   (CN) .......................... 2016 1 0821555

(51) Int. Cl.
*F28F 7/00*     (2006.01)
*H05K 7/20*     (2006.01)
(Continued)

(52) U.S. Cl.
CPC ......... *H05K 7/20481* (2013.01); *B32B 9/007* (2013.01); *F28F 21/02* (2013.01);
(Continued)

(58) Field of Classification Search
CPC ........... H05K 7/20481; H05K 7/20507; H05K 7/20518; B32B 9/007; B32B 2307/302; F28F 21/02; H01L 23/3735
(Continued)

(56) References Cited

U.S. PATENT DOCUMENTS

| 7,592,695 B2 | 9/2009 | Reis et al. |
| 2012/0085526 A1 | 4/2012 | Yeh |

(Continued)

FOREIGN PATENT DOCUMENTS

| CN | 1567578 A | 1/2005 |
| CN | 101312629 A | 11/2008 |

(Continued)

OTHER PUBLICATIONS

Qizhong Huang. Fabrication, structure and application of hign-performance carbon/carbon composites, published in Central and Southern University Press, Dec. 2012. total 5 pages. With English abstract.

(Continued)

*Primary Examiner* — Davis D Hwu
(74) *Attorney, Agent, or Firm* — Womble Bond Dickinson (US) LLP

(57) ABSTRACT

A heat sink, which includes a first surface and a second surface opposite to the first surface, where the second surface includes a plurality of sub-surfaces, and each sub-surface is configured to be in contact with a surface of a heat emitting element; the plurality of sub-surfaces include a first sub-surface, a thickness between the first sub-surface and the first surface is less than a thickness between the first surface and each of the plurality of sub-surfaces except the first sub-surface; and the heat sink includes a plurality of layers of graphene sheets, each layer of graphene sheet includes a plurality of flake graphite particles, and two adjacent flake graphite particles located in a same layer of graphene sheet are covalently bonded.

18 Claims, 7 Drawing Sheets

(51) Int. Cl.
*H01L 23/373* (2006.01)
*B32B 9/00* (2006.01)
*F28F 21/02* (2006.01)

(52) U.S. Cl.
CPC ..... *H01L 23/3735* (2013.01); *H05K 7/20509* (2013.01); *H05K 7/20518* (2013.01); *B32B 2307/302* (2013.01)

(58) Field of Classification Search
USPC ...................................................... 165/80.2
See application file for complete search history.

(56) References Cited

U.S. PATENT DOCUMENTS

| | | |
|---|---|---|
| 2014/0116661 A1 | 5/2014 | Xu et al. |
| 2014/0190676 A1 | 7/2014 | Zhamu et al. |
| 2015/0118482 A1* | 4/2015 | Kagawa .................. B32B 37/24 428/323 |
| 2015/0151973 A1 | 6/2015 | Lee et al. |
| 2015/0217538 A1 | 8/2015 | Zhamu et al. |
| 2015/0237762 A1 | 8/2015 | Holt et al. |
| 2018/0187987 A1* | 7/2018 | Cai .......................... F28F 3/00 |

FOREIGN PATENT DOCUMENTS

| | | |
|---|---|---|
| CN | 102709262 A | 10/2012 |
| CN | 202652815 U | 1/2013 |
| CN | 102917574 A | 2/2013 |
| CN | 103219066 A | 7/2013 |
| CN | 103456931 A | 12/2013 |
| CN | 104244667 A | 12/2014 |
| CN | 104619632 A | 5/2015 |
| CN | 204634261 U | 9/2015 |
| CN | 105331109 A | 2/2016 |
| CN | 105860939 A | 8/2016 |
| CN | 106550585 A | 3/2017 |

OTHER PUBLICATIONS

Baoquan Hu et al. Advanced composite materials, Published in National Defense Industry Press, Jun. 2006. total 267 pages. With English abstract.

* cited by examiner

HEAT SINK, PREPARATION METHOD THEREFOR, AND COMMUNICATIONS DEVICE

CROSS-REFERENCE TO RELATED APPLICATIONS

This application is a continuation of International Application No.PCT/CN2017/100551, filed on Sep. 5, 2017, which claims priority to Chinese Patent Application No.201610821555.1 filed on Sep. 13, 2016, The disclosures of the aforementioned applications are hereby incorporated by reference in their entireties.

TECHNICAL FIELD

This application relates to the field of heat dissipation technologies, and in particular, to a heat sink, a preparation method therefor, and a communications device.

BACKGROUND

A communications device usually includes a plurality of heat emitting elements therein. A heat emitting element generates heat during operation. If the heat is not dissipated in time, when a temperature value in the heat emitting element exceeds a maximum temperature value that the heat emitting element can withstand during normal operation, a service life of the heat emitting element is shortened or the heat emitting element is damaged. To dissipate the heat in time, each heat emitting element corresponds to a separate heat sink in the prior art. After absorbing heat generated by a corresponding heat emitting element, each heat sink located in a central section of the communications device transfers the absorbed heat to an adjacent heat sink. Specifically, a heat sink transfers heat to an adjacent heat sink, and the absorbed heat is finally dissipated by using a heat sink located at an edge of the communications device. However, because end surfaces of two adjacent heat sinks are separated from each other, relatively large thermal resistance exists between the two adjacent heat sinks. Consequently, heat is transferred between the adjacent heat sinks at a relatively low speed. This may further lead to an excessively high local temperature of the communications device, shortening the service life of the communications device or damaging the communications device.

SUMMARY

This application provides a heat sink. The heat sink is configured to perform heat dissipation on at least two heat emitting elements, to resolve a problem that heat is transferred at a low speed between adjacent heat sinks due to relatively large thermal resistance between the adjacent heat sinks, and enhance a heat dissipation capability to an extent. In addition, a communications device that uses the heat sink and a preparation method for the heat sink are further provided.

According to a first aspect, an embodiment of this application provides a heat sink, including a first surface and a second surface opposite to the first surface, where the second surface includes a plurality of sub-surfaces, and each sub-surface is configured to be in contact with a surface of a heat emitting element;

the plurality of sub-surfaces include at least one first sub-surface, and a thickness between the first sub-surface and the first surface is less than a thickness between the first surface and each of the plurality of sub-surfaces except the first sub-surface; and the heat sink includes a plurality of layers of graphene sheets, each layer of graphene sheet includes a plurality of flake graphite particles, and two adjacent flake graphite particles located in a same layer of graphene sheet are covalently bonded.

According to the heat sink provided in this embodiment of this application, the two adjacent flake graphite particles located in the same layer of graphene sheet are covalently bonded, and therefore heat is transferred in the heat sink at a higher speed compared with in the prior art, so that a prior-art problem that heat transfer efficiency is relatively low because two adjacent end surfaces of two adjacent heat sinks are separated from each other is resolved, the heat transfer efficiency of the heat sink is improved, and a frequency that a partial hotspot appears in the heat sink is reduced.

With reference to the first aspect, in a first possible implementation, the plurality of layers of graphene sheets are stacked layer by layer.

With reference to the first aspect or the first possible implementation of the first aspect, in a second possible implementation, the first surface is planar, and a direction of the thickness between each sub-surface and the first surface is perpendicular to a plane in which the first surface lies.

With reference to the second possible implementation of the first aspect, in a third possible implementation, the plurality of layers of graphene sheets are stacked layer by layer along a direction perpendicular to the first surface.

With reference to the second possible implementation of the first aspect or the third possible implementation of the first aspect, in a fourth possible implementation, a layer on which each layer of graphene sheet is located is parallel to the first surface.

With reference to any one of the first aspect, or the first possible implementation of the first aspect to the fourth possible implementation of the first aspect, in a fifth possible implementation, each sub-surface is planar.

With reference to any one of the first aspect, or the first possible implementation of the first aspect to the fifth possible implementation of the first aspect, in a sixth possible implementation, a thickness value between the first sub-surface and the first surface is greater than or equal to 8 microns and less than or equal to 50 microns.

With reference to any one of the first aspect, or the first possible implementation of the first aspect to the sixth possible implementation of the first aspect, in a seventh possible implementation, the plurality of sub-surfaces further include at least one second sub-surface, and a thickness between the second sub-surface and the first surface is greater than a thickness between the first surface and each of the plurality of sub-surfaces except the second sub-surface.

In a specific scenario in which the heat sink is used, usually, surfaces of a plurality of heat emitting elements on which heat dissipation should be performed are not flush. Using a smartphone as an example for description, a metal frame located in the smartphone usually carries a plurality of heat emitting elements. The plurality of heat emitting elements have different heights and different power consumption, and therefore heat dissipation areas with a plurality of thicknesses are provided in a heat sink, to better match the heat emitting elements with the different heights, thereby providing optimal heat dissipation contact in a narrow environment.

With reference to the seventh possible implementation of the first aspect, in an eighth possible implementation, a thickness between the second sub-surface and the first surface is greater than 50 microns and less than or equal to 200 microns.

With reference to any one of the first aspect, or the first possible implementation of the first aspect to the eighth possible implementation of the first aspect, in a ninth possible implementation, two adjacent layers of graphene sheets are bonded by a van der Waals force.

With reference to any one of the first aspect, or the first possible implementation of the first aspect to the ninth possible implementation of the first aspect, in a tenth possible implementation, a density of the heat sink is in a range of 0.8 g/cm$^3$ to 2.2 g/cm$^3$.

With reference to any one of the first aspect, or the first possible implementation of the first aspect to the tenth possible implementation of the first aspect, in an eleventh possible implementation, the flake graphite particles include a graphene nanosheet, a nano-graphite sheet, or an expanded graphite sheet.

According to a second aspect, an embodiment of this application provides a communications device, including a metal frame, a plurality of heat emitting elements, and the heat sink according to any one of the first aspect, or the first possible implementation of the first aspect to the eleventh possible implementation of the first aspect. A quantity of the plurality of heat emitting elements is the same as a quantity of the plurality of sub-surfaces, each sub-surface is in close contact with one heat emitting element, and the first surface is in close contact with a surface of the metal frame.

Compared with a heat sink in the prior art, the heat sink provided in the foregoing embodiment has higher heat transfer efficiency. Therefore, the communications device that uses the heat sink has a better heat dissipation capability.

With reference to the second aspect, in a first possible implementation, an insulation layer is adhered to the second surface.

Flake graphite particles included in the heat sink are electrically conductive, and therefore the insulation layer is adhered to the second surface of the heat sink, so that the second surface of the heat sink may have electrical insulation performance. In this way, it can be avoided that, when a heat sink performs heat dissipation on a circuit board or the like, a short circuit occurs on the circuit board or the like due to debris shedding in the heat sink. In addition, after the second surface of the heat sink is in close contact with the insulation layer, a mechanical strength of the heat sink can be increased, and bending resistance of the heat sink can be improved.

With reference to the first possible implementation of the second aspect, in a second possible implementation, a thickness of the insulation layer is in a range of 1 micron to 25 microns.

With reference to the second aspect, the first possible implementation of the second aspect, or the second possible implementation of the second aspect, in a third possible implementation, the plurality of heat emitting elements include at least one first heat emitting element, a quantity of the at least one first heat emitting element is the same as a quantity of the at least one first sub-surface, and each first sub-surface is in close contact with one first heat emitting element; and power consumption of the first heat emitting element is less than power consumption of each of the plurality of heat emitting elements except the first heat emitting element.

With reference to any one of the second aspect, or the first possible implementation of the second aspect to the third possible implementation of the second aspect, in a fourth possible implementation, the plurality of heat emitting elements further include at least one second heat emitting element, a quantity of the at least one second heat emitting element is the same as a quantity of the at least one second sub-surface, and each second sub-surface is in close contact with one second heat emitting element; and power consumption of the second heat emitting element is greater than power consumption of each of the plurality of heat emitting elements except the second heat emitting element.

Technically, a larger thickness of the heat sink indicates a better heat dissipation effect. Heat dissipation is performed on a part with high power consumption by using a relatively thick heat dissipation area, and heat dissipation is performed on a part with low power consumption by using a relatively thin heat dissipation area. This helps implement relatively even distribution of heat in the heat sink, so that a frequency that a partial hotspot appears in the communications device can be reduced.

According to a third aspect, an embodiment of this application further provides a preparation method for a heat sink. The method includes:

dispersing flake graphite particles in a solvent, to form a paste or gel-like mixture, where the solvent is water or an organic solvent;

coating a base material with the mixture, to form a wet film; and performing heat treatment on the wet film, to obtain the heat sink according to any one of the first aspect, or the first possible implementation of the first aspect to the eleventh possible implementation of the first aspect.

With reference to the third aspect, in a first possible implementation, the performing heat treatment on the wet film, to obtain the heat sink specifically includes:

performing baking treatment on the wet film, so that the solvent in the wet film evaporates, to obtain a surface-dried thin film; and performing carbonization treatment on the surface-dried thin film, to obtain the heat sink.

A purpose of the carbonization treatment is to remove a non-carbon element such as H, O, S, or N in the surface-dried thin film, to obtain a carbonized thin film. Compared with the surface-dried thin film, the carbonized thin film has a better heat conduction capability.

With reference to the first possible implementation of the third aspect, in a second possible implementation, the performing carbonization treatment on the surface-dried thin film, to obtain the heat sink specifically includes:

performing carbonization treatment on the surface-dried thin film, to obtain a carbonized thin film; and performing graphitization treatment on the carbonized thin film, to obtain the heat sink.

To achieve a larger coefficient of thermal conductivity, graphitization treatment with a higher temperature should be performed on the carbonized thin film, to enable a carbon mesh plane in the carbonized thin film to further grow, thereby transforming an agraphitic carbon layer into a graphite crystal structure.

With reference to the third aspect, the first possible implementation of the third aspect, or the second possible implementation of the third aspect, in a third possible implementation, after the heat sink is obtained, the method further includes:

performing compaction treatment on the heat sink, to obtain a compacted heat sink, where a density of the compacted heat sink is in a range of 0.8 g/cm³ to 2.2 g/cm³.

With reference to any one of the third aspect, or the first possible implementation of the third aspect to the third possible implementation of the third aspect, in a fourth possible implementation, the mixture has a liquid crystal phenomenon.

With reference to any one of the third aspect, or the first possible implementation of the third aspect to the fourth possible implementation of the third aspect, in a fifth possible implementation, chemical functional groups are grafted on surfaces of the flake graphite particles. The chemical functional groups are used for enabling a covalent bond to be formed between adjacent flake graphite particles.

With reference to any one of the third aspect, or the first possible implementation of the third aspect to the fifth possible implementation of the third aspect, in a sixth possible implementation, when the solvent is water, an active liquid is added to the water. The active liquid is used for enabling a covalent bond to be formed between adjacent flake graphite particles.

With reference to any one of the third aspect, or the first possible implementation of the third aspect to the sixth possible implementation of the third aspect, in a seventh possible implementation, a mass percentage of the flake graphite particles in the mixture is greater than or equal to 1% and less than or equal to 90%.

With reference to any one of the third aspect, or the first possible implementation of the third aspect to the seventh possible implementation of the third aspect, in an eighth possible implementation, the flake graphite particles include a graphene nanosheet, an oxidized graphene nanosheet, a nano-graphite sheet, or an expanded graphite sheet.

DESCRIPTION OF EMBODIMENTS

To facilitate understanding of solutions provided in embodiments of this application, the following concepts are described first.

1. A metal frame is a frame that is located in a communications device and that is configured to play a supporting function, and usually has a tabulate shape. In a terminal device, the metal frame may also be referred to as a middle frame, and all of a battery, a mainboard, a camera, a display screen, and the like are disposed on two sides of the metal frame by using a heat sink.

2. A flake graphite particle is a powder particle that has a graphite crystal structure and a flake shape.

Figure 1:
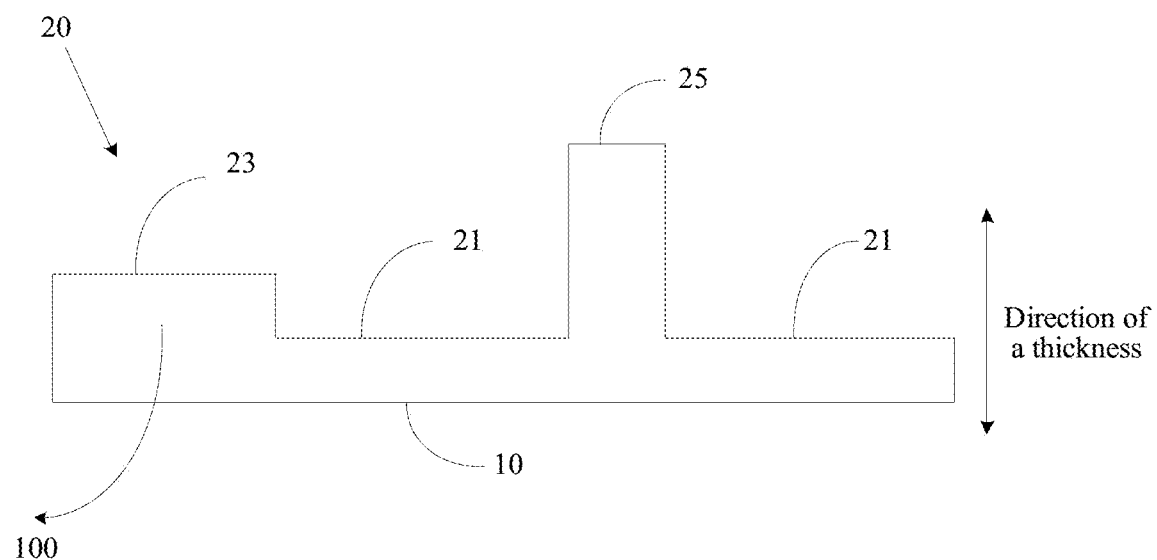
FIG. 1 is a schematic structural diagram of a heat sink according to an embodiment of this disclosure.

FIG. 1 is a schematic structural diagram of a heat sink 100 according to an embodiment of this application. The heat sink 100 includes a first surface 10 and a second surface 20. The first surface 10 and the second surface 20 are opposite to each other, and the second surface 20 is rough.

Specifically, the second surface 20 includes a plurality of sub-surfaces. As shown in FIG. 1, the second surface 20 includes two first sub-surfaces 21, one sub-surface 23, and one sub-surface 25. Each sub-surface is configured to be in contact with a surface of a heat emitting element, to absorb heat generated by a corresponding heat emitting element, thereby performing heat dissipation on the corresponding heat emitting element. A thickness between the first sub-surface 21 and the first surface 10 is less than a thickness between the first surface 10 and each of the other sub-surfaces (the sub-surface 23 and the sub-surface 25 shown in FIG. 1) different from the first sub-surfaces 21 in the second surface 20.

Figure 2A:
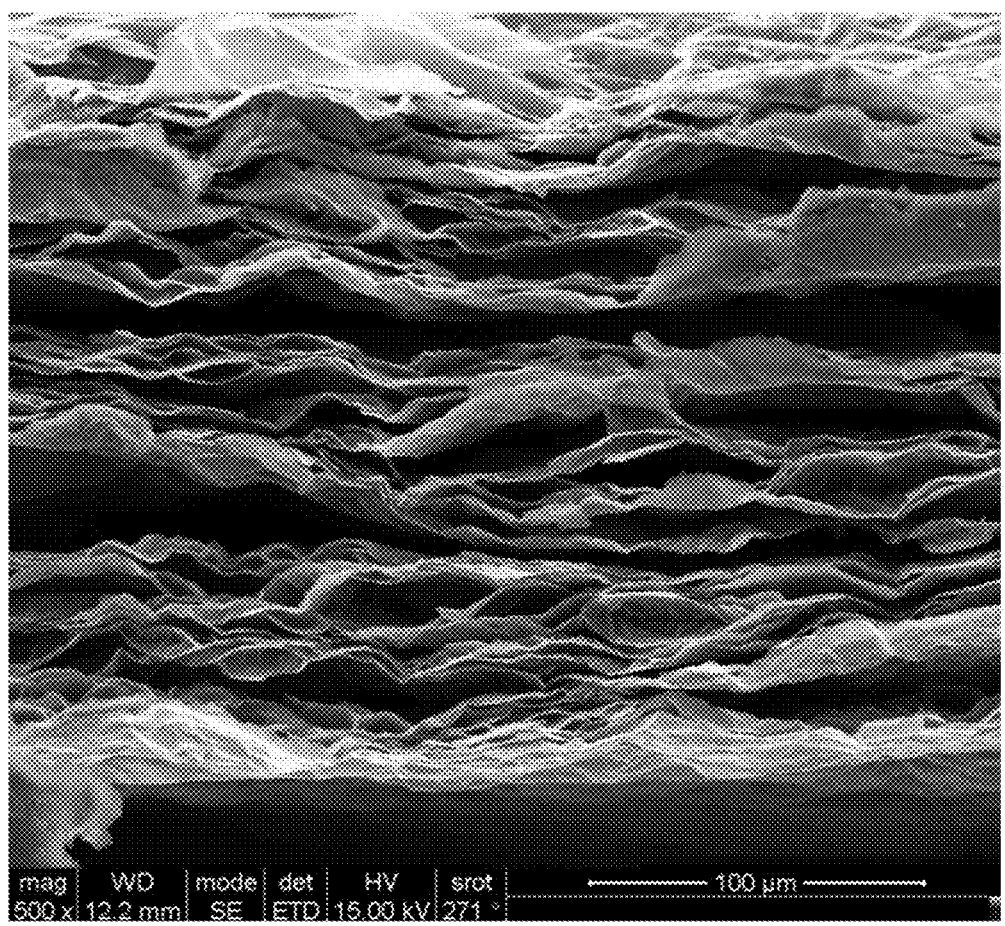
FIG. 2A is a high-magnification view of a heat sink according to an embodiment of this application.
Figure 2B:
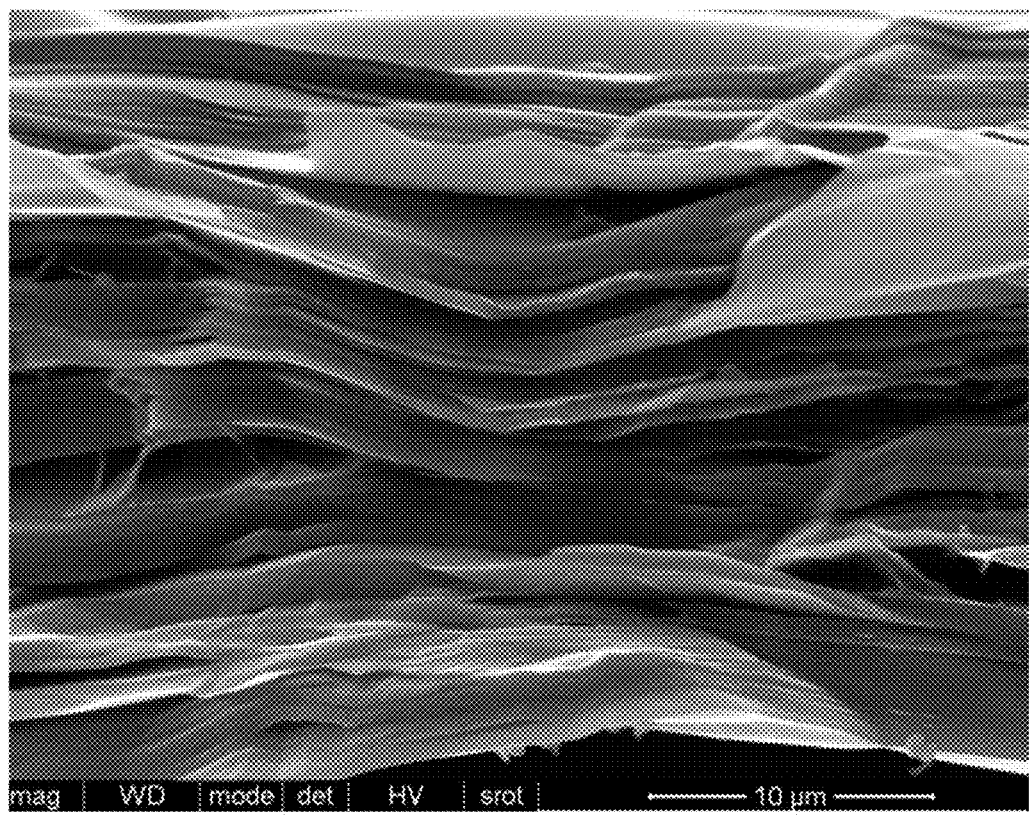
FIG. 2B is also a high-magnification view of a heat sink according to an embodiment of this disclosure.

Further, referring to FIG. 2A and FIG. 2B, in this embodiment of this application, the heat sink 100 includes a plurality of layers of graphene sheets, and the plurality of layers of graphene sheets are stacked layer by layer. It should be noted that, two adjacent layers of graphene sheets are bonded by a van der Waals force.

It should be noted that, a thickness of a graphene sheet is usually at the nanometric or micro scale, and therefore in this embodiment of this application, the heat sink 100 usually includes 10000 or more layers of graphene sheets.

Figure 3:
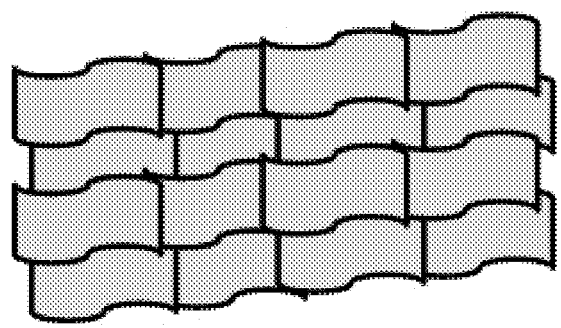
FIG. 3 is a schematic structural diagram of a layer of graphene sheet in a heat sink according to an embodiment of this disclosure.

FIG. 3 is a schematic structural diagram of a layer of graphene sheet. Each layer of graphene sheet includes a plurality of flake graphite particles, and two adjacent flake graphite particles located in a same layer of graphene sheet are covalently bonded.

Figure 4A:
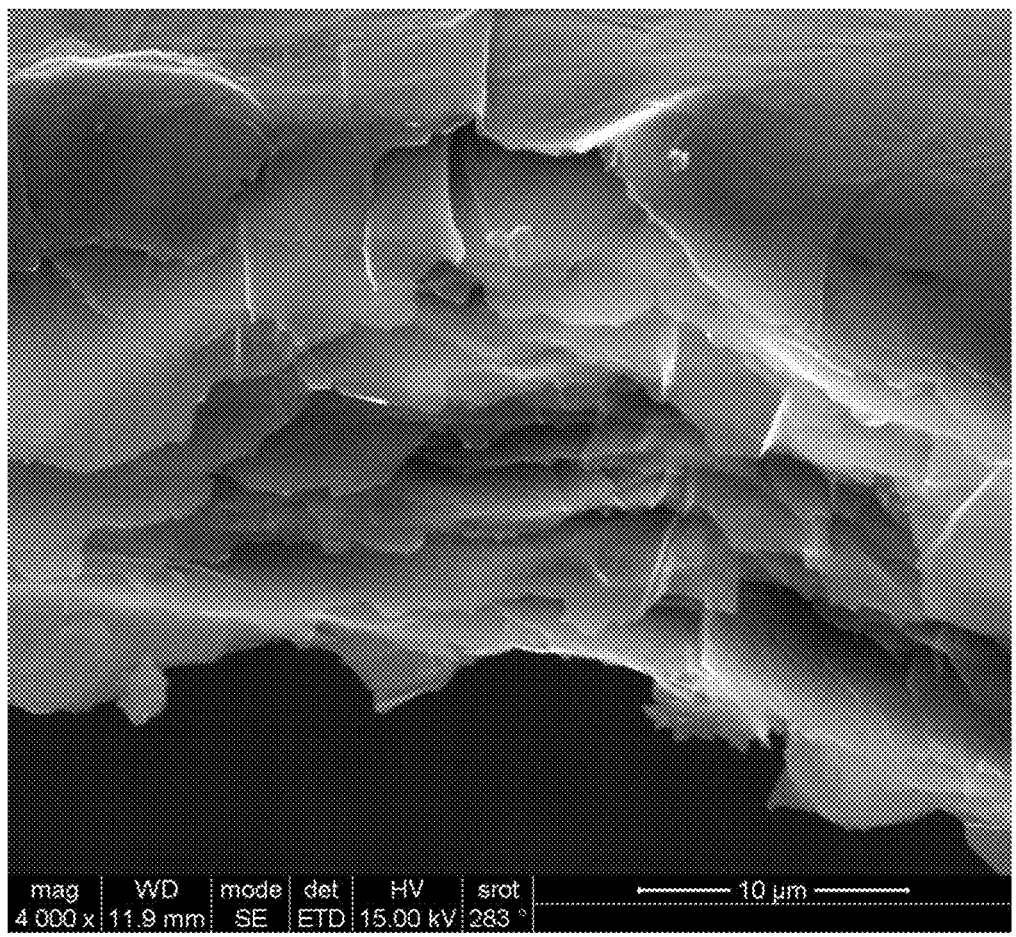
FIG. 4A and FIG. 4B are both high-magnification views of a fracture part of a heat sink according to an embodiment of this disclosure.
Figure 4B:
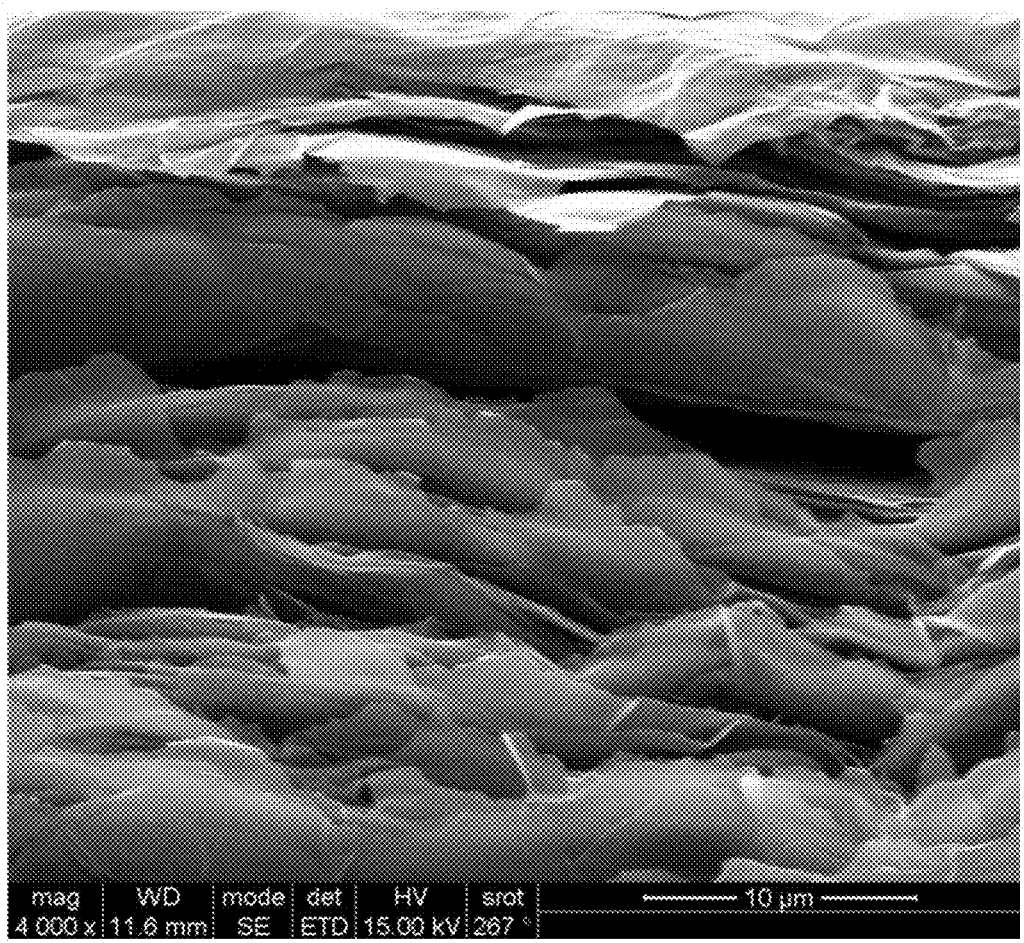

It should be noted that, an acting force of combination by a covalent bond between two adjacent flake graphite particles is far less than an atomic binding force of either of the two adjacent flake graphite particles. Therefore, when the heat sink is fractured, cracking of the heat sink is more prone to occur at a contacting location between the two adjacent flake graphite particles. Both FIG. 4A and FIG. 4B are a schematic diagram of a fracture part that is of a heat sink and that is observed by using a scanning electron microscope. It can be learned that each layer of graphene sheet has an irregular shape on an edge of the fracture part, and different layers of graphene sheets have different shapes on an edge of the fracture part.

With reference to the two first sub-surfaces 21, the sub-surface 23, and the sub-surface 25 that are shown in FIG. 1, it should be noted that, each common sub-surface is planar, because currently a surface of a common heat emitting element is planar. A sub-surface should contact a surface of a heat emitting element, to absorb heat generated by the heat emitting element, and therefore a larger contact area between the sub-surface and the surface of the heat emitting element is better. Therefore, it should be noted that, when the surface of the heat emitting element is a curved surface, the sub-surface should be made into a curved surface that adapts to the surface of the heat emitting element, to increase a contact area between the sub-surface and the surface of the heat emitting element. Therefore, a plane of each sub-surface may be planar, or may be curved. This is specifically determined by a shape of a surface of a heat emitting element that is in contact with the sub-surface.

It should be noted that, when the plurality of sub-surfaces include two or more first sub-surfaces, a thickness between each first sub-surface and the first surface is the same.

It can be learned that, when the heat sink 100 provided in this embodiment of this application is used, the second surface 20 of the heat sink 100 includes a plurality of sub-surfaces, and each of the plurality of sub-surfaces may be in contact with a surface of a heat emitting element. Therefore, the heat sink 100 may simultaneously be in contact with surfaces of a plurality of heat emitting elements at the same time, in other words, simultaneously absorb heat generated by the plurality of heat emitting elements. In the heat sink 100, the two adjacent flake graphite particles located in the same layer of graphene sheet are covalently bonded, and therefore heat is transferred in the heat sink 100 at a higher speed compared with in the prior art, so that a prior-art problem that heat transfer efficiency is relatively low because two adjacent end surfaces of two adjacent heat sinks are separated from each other is resolved, and the heat transfer efficiency of the heat sink is improved.

It should be noted that, carbon content in the heat sink provided in this embodiment of this application should be greater than or equal to 90%; or carbon content in the heat sink is greater than or equal to 99%.

In this embodiment of this application, the first surface 10 may be planar, or may be non-planar. For example, the first surface 10 is rough, or the first surface 10 is even a curved surface. Specifically, a shape of the first surface 10 should match a shape of a surface that is in close contact with the first surface 10. For example, when the first surface 10 is in close contact with a first surface of a metal frame in a communications device, to increase closeness in which the first surface 10 is in close contact with the metal frame, a shape of the first surface should match a shape of the first surface of the metal frame.

In another embodiment of this application, the first surface 10 is planar. When the first surface 10 is planar, a direction of a thickness of each sub-surface (23, 25, or 21) and the first surface 10 is perpendicular to a plane in which the first surface 10 lies. It should be noted that, the plane should be subject to habitual understanding of a person skilled in the art, and should not be understood as an absolute plane without considering a characteristic of the art.

Further, when the first surface 10 is planar, the plurality of layers of graphene sheets included in the heat sink 100 are stacked layer by layer in a direction perpendicular to the first surface.

It should be noted that, each layer of graphene sheet may be parallel to the first surface 10. The parallel should be roughly parallel. The parallel should be subject to understanding of the person skilled in the art, and should not be understood as absolute parallel in mathematics. It should be noted that, each layer of graphene sheet is bent in high-magnification views of a side of the heat sink shown in FIG. 2A and FIG. 2B because FIG. 2A and FIG. 2B are obtained by magnifying the side of the heat sink by 4000 times. When high magnification is not performed on the side of the heat sink, based on the habitual understanding of the person skilled in the art, it may be considered that a plane formed by each layer of graphene sheet is parallel to the first surface 10.

Referring to FIG. 3, it should be further noted that, after high magnification is performed on a flake graphite particle located on a layer, it is easy to see that the flake graphite particle is parallel to the plane in which the first surface 10 lies.

In still another embodiment of this application, a thickness value between the first sub-surface 21 and the first surface 10 may be greater than or equal to 8 microns and less than or equal to 50 microns.

In yet another embodiment of this application, the second surface 20 further includes at least one second sub-surface. A thickness between the second sub-surface and the first surface 10 is greater than a thickness between the first surface 10 and each of other sub-surfaces than the second sub-surface in the second surface 20. In a heat sink shown in FIG. 1, the second sub-surface herein corresponds to the sub-surface 25.

It should be noted that, when the second surface 20 includes two or more second sub-surfaces, a thickness between each of the two or more second sub-surfaces and the first surface 10 is the same.

In yet another embodiment of this application, a thickness value between the second sub-surface and the first surface 10 may be greater than 50 microns and less than or equal to 200 microns.

In yet another embodiment of this application, a density of the heat sink 100 is in a range of 0.8 g/cm$^3$ to 2.2 g/cm$^3$. It should be noted that, from a periphery of each sub-surface included in the second surface 20 of the heat sink 100, and along a direction of a thickness, the heat sink 100 may be divided into a plurality of areas. A quantity of the areas included in the heat sink 100 is the same as a quantity of the sub-surfaces included in the second surface 20. The heat sink 100 shown in FIG. 1 is divided into four areas. Specifically, each area located in the heat sink 100 may have one density, and densities of different areas may be different or may be the same. Further, a density of each area may be even, or may be uneven. It should be understood that, the evenness herein is not absolute, and should be subject to the understanding of the person skilled in the art.

Figure 5:
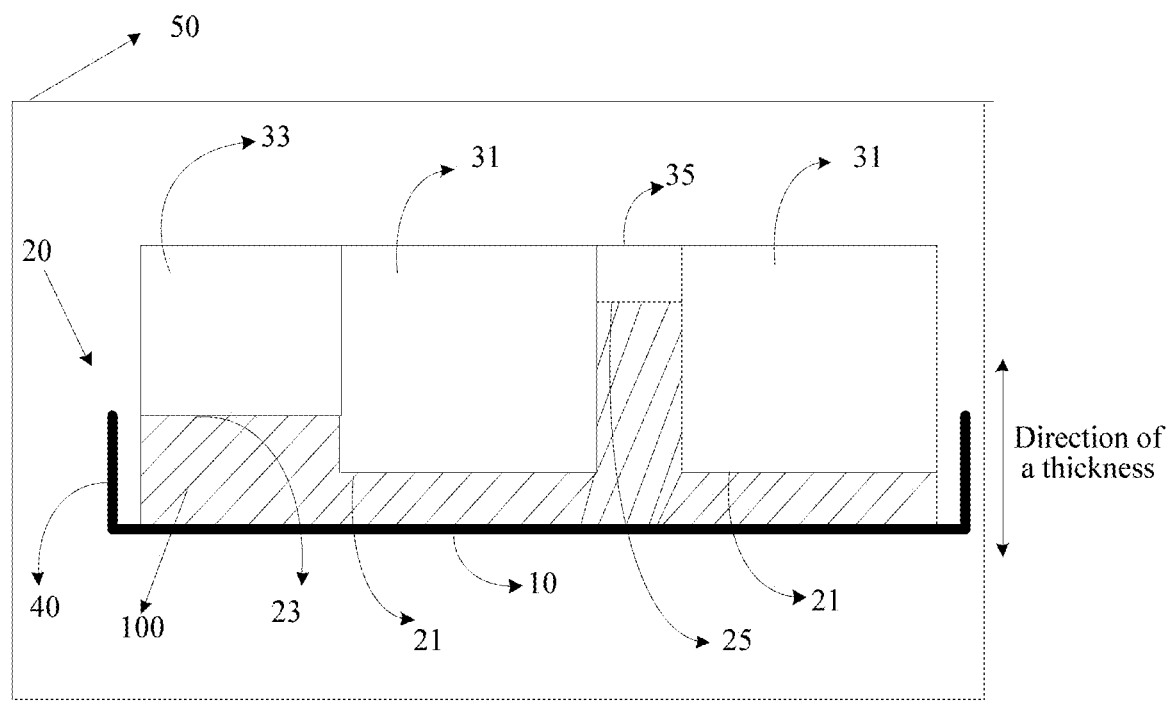
FIG. 5 is a schematic structural diagram of a communications device according to an embodiment of this disclosure.

FIG. 5 is a schematic structural diagram of a communications device 50. The communications device 50 may be a terminal device such as a smartphone, a tablet computer, or a notebook computer, or may be a hard disk. In this embodiment of this application, descriptions are provided by using an example in which the communications device 50 is a smartphone.

As shown in FIG. 5, the communications device 50 includes a metal frame 40, a plurality of heat emitting elements (respectively two heat emitting elements 31, one heat emitting element 33, and one heat emitting element 35) and the heat sink 100 described in Embodiment 1. A quantity of sub-surfaces included in the heat sink 100 is the same as a quantity of the plurality of heat emitting elements, and each sub-surface is in close contact with a surface of a heat emitting element, to absorb heat generated by a corresponding heat emitting element, and perform heat dissipation on the corresponding heat emitting element. In the communications device 50 shown in FIG. 5, the sub-surface 23 in the heat sink 100 is in close contact with the heat emitting element 33, each first sub-surface 21 in the heat sink 100 is in close contact with one heat emitting element 31, and the sub-surface 25 in the heat sink 100 is in close contact with the heat emitting element 35. It should be noted that, for a characteristic of the heat sink 100 applied to the communications device 50, refer to the foregoing Embodiment 1. Details are not described again in Embodiment 2.

It should be noted that, the heat emitting element in this embodiment of this application may be a display screen, a light source area of the display screen, a camera, a battery, a mainboard, or the like. Naturally, all of the display screen, the light source area of the display screen, the camera, and the battery should be electrically interconnected to the mainboard. A plurality of types of chips may be assembled on the mainboard, and the plurality of types of chips are respectively configured to implement different functions. The plurality of types of chips may be an image processing chip, a Power Management IC, a power amplifier chip, a processor chip, and the like. It should be noted that, due to a problem of signal interference between two adjacent chips, electromagnetic shielding should be further performed on the two adjacent chips.

With reference to FIG. 5, it is easy to learn that, the heat sink 100 is located between the metal frame 40 and the heat emitting elements (31, 33, and 35), and the first surface 10 of the heat sink 100 is in close contact with the metal frame 40.

As described in the foregoing Embodiment 1, compared with a heat sink in the prior art, the heat sink 100 has higher heat transfer efficiency. Therefore, correspondingly, the communications device 50 that uses the heat sink 100 has a better heat dissipation capability.

It should be noted that, an insulation layer is adhered to the second surface 20. Graphene is conductive. Therefore, the insulation layer is disposed, so that the second surface of the heat sink has an electric insulation property. In this way, it can be avoided that, when a heat sink performs heat dissipation on a circuit board or the like, a short circuit occurs on the circuit board or the like due to debris shedding in the heat sink. In addition, after the second surface of the heat sink is in close contact with the insulation layer, a mechanical strength of the heat sink can be increased, and bending resistance of the heat sink can be improved. The insulation layer is usually a thermoplastic plastic thin film, and the thermoplastic plastic thin film may be polyethylene (PE), polyethylene terephthalate (PET), or the like. The insulation layer is adhered to the second surface 20 when the temperature is high.

A thickness of the insulation layer may be in a range of 1 micron to 25 microns, or the thickness of the insulation layer may be in a range of 5 microns to 15 microns.

In another embodiment of this application, the plurality of heat emitting elements include a first heat emitting element, and power consumption of the first heat emitting element is less than power consumption of each of all the heat emitting elements except the first heat emitting element. With reference to FIG. 5, the heat emitting element 31 is a first heat emitting element; accordingly the communications device 50 includes two first heat emitting elements, and power consumption of the first heat emitting elements is not only less than power consumption of the heat emitting element 33, but also less than power consumption of the heat emitting element 35.

Further, a quantity of the first heat emitting elements is the same as a quantity of first sub-surfaces included in the heat sink 100. The first heat emitting elements are in a one-to-one correspondence to the first sub-surfaces, and each first sub-surface is configured to absorb heat generated by a corresponding first heat emitting element. With reference to FIG. 5, both a quantity of heat emitting elements 31 and a quantity of sub-surfaces 21 are two. Each sub-surface 21 is in close contact with one heat emitting element 31, and each sub-surface 21 is configured to perform heat dissipation on a corresponding heat emitting element 31.

It should be noted that, different heat emitting elements have different power consumption, and a heat emitting element having higher power consumption usually generates more heat than a heat emitting element having lower power consumption provided that they work/operate for a same period of time; therefore, different heat dissipation areas in the heat sink 100 should have different heat dissipation capabilities. The heat dissipation areas are obtained by cutting the heat sink 100 from a peripheral of each sub-surface and along a direction of a thickness. The heat sink 100 shown in FIG. 5 has four sub-surfaces (respectively two sub-surfaces 21, one sub-surface 23, and one sub-surface 25). Then, the heat sink 100 is divided into four heat dissipation areas, and each heat dissipation area corresponds to one sub-surface. When densities of the heat dissipation areas are close to each other, usually, a larger thickness of a heat dissipation area indicates a higher heat dissipation capability of the heat dissipation area. A thickness of heat dissipation areas corresponding to the sub-surfaces 21 is less than a thickness of another heat dissipation area, and therefore power consumption of the heat emitting element 31 that is in close contact with the sub-surfaces 21 is also less than power consumption of another heat emitting element.

It should be noted that, a thickness of a heat dissipation area corresponding to the sub-surface 25 is greater than a thickness of another heat dissipation area, and therefore power consumption of the heat emitting element 35 that is in close contact with the sub-surface 25 is also greater than power consumption of another heat emitting element.

For heat emitting elements having different power consumption, a heat dissipation area having a larger thickness performs heat dissipation on a heat emitting element having higher power consumption, and a heat dissipation area having a smaller thickness performs heat dissipation on a heat emitting element having lower power consumption, so that heat absorbed by heat dissipation areas that are in contact with the heat emitting elements having different power consumption is relatively balanced, and heat on the heat sink 100 is evenly distributed.

In still another embodiment of this application, the plurality of heat emitting elements further include a second heat emitting element, and power consumption of the second heat emitting element is greater than power consumption of each of all the heat emitting elements except the second heat emitting elements; and a quantity of second heat emitting elements is the same as a quantity of second sub-surfaces included in the heat sink 100. The second heat emitting elements are in a one-to-one correspondence to the second sub-surfaces, and each second sub-surface is configured to perform heat dissipation on a corresponding second heat emitting element.

With reference to FIG. 5, the heat emitting element 35 is a second heat emitting element; accordingly the communications device 50 includes one second heat emitting element, and power consumption of the second heat emitting element is not only greater than power consumption of the heat emitting elements 31, but also greater than power consumption of the heat emitting element 33. In addition, both a quantity of heat emitting elements 31 and a quantity of sub-surfaces 21 are two, each sub-surface 21 is in close contact with one heat emitting element 31, and each sub-surface 21 is configured to perform heat dissipation on a corresponding heat emitting element 31.

Figure 6:
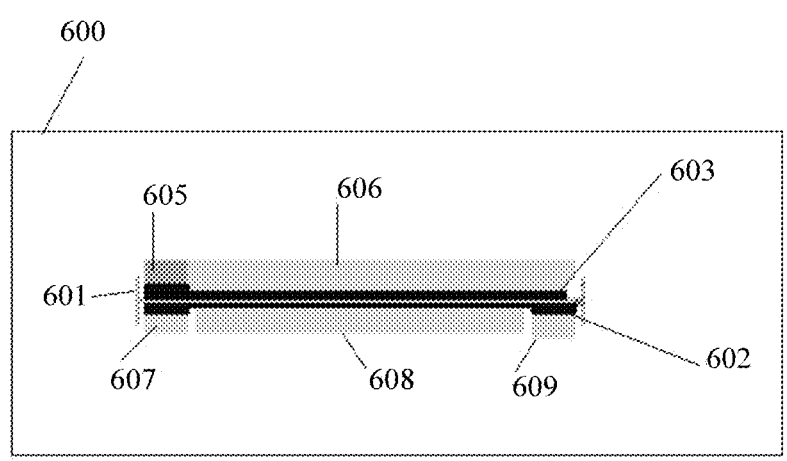
FIG. 6 is a schematic structural diagram of another communications device according to an embodiment of this disclosure.

Further referring to a communications device 600 shown in FIG. 6, and in particular, a metal frame 601 located in the communications device 600. Two sides of the metal frame are respectively in close contact with a heat sink 602 and a heat sink 603. Both the heat sink 602 and the heat sink 603 are the heat sink described in Embodiment 1. The heat sink 602 is configured to absorb heat generated by a heat emitting element 605 and a heat emitting element 606, to perform heat dissipation on the heat emitting element 605 and the heat emitting element 606. The heat sink 603 is configured to absorb heat generated by a heat emitting element 607, a heat emitting element 608, and a heat emitting element 609, to perform heat dissipation on the heat emitting element 607, the heat emitting element 608, and the heat emitting element 609.

Specifically, when the communications device 600 is a smartphone, the heat emitting element 605 may be a light source area of a display screen, the heat emitting element 606 may be the display screen, the heat emitting element 607 may be a camera, the heat emitting element 608 may be a battery, and the heat emitting element 609 may be a mainboard.

With reference to the communications device 600 shown in FIG. 6, it can be learned that, both side surface of the metal frame 601 may be further in close contact with the heat sinks, so that heat dissipation is performed on heat emitting elements integrated on two sides of the metal frame 601, thereby improving a heat dissipation capability of the communications device 600.

Figure 7:
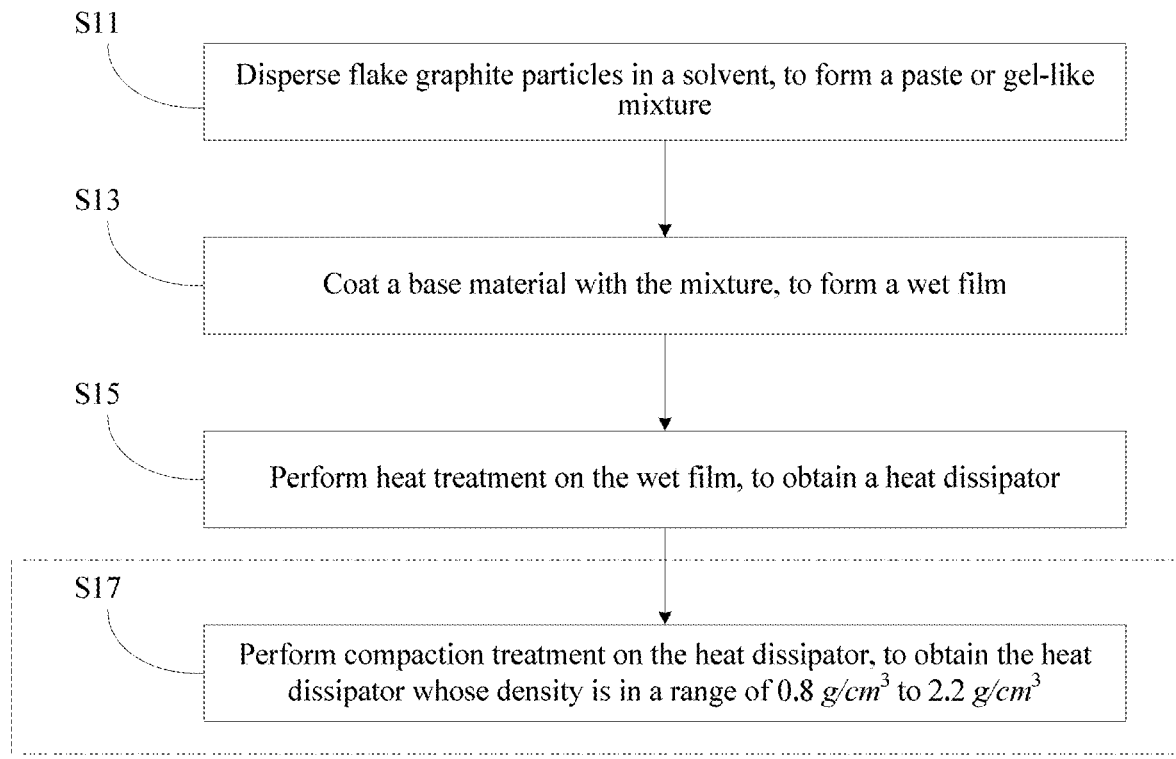
FIG. 7 is a schematic flowchart of a preparation method for a heat sink according to an embodiment of this disclosure.

FIG. 7 is a schematic flowchart of a preparation method for a heat sink. For a related description of the heat sink, refer to Embodiment 1. Details are not described herein again. Specifically, a preparation method for the heat sink includes the following blocks.

S11: Disperse flake graphite particles in a solvent, to form a paste or gel-like mixture, where the solvent is water or an organic solvent.

Specifically, the flake graphite particles may include a graphene nanosheet, an oxidized graphene nanosheet, a nano-graphite sheet, or an expanded graphite sheet.

When the flake graphite particles include the graphene nanosheet, the oxidized graphene nanosheet, or the nano-graphite sheet, all of a thickness of the graphene nanosheet, the oxidized graphene nanosheet, and the nano-graphite sheet may be less than or equal to 100 nanometers; or all of a thickness of the graphene nanosheet, the oxidized graphene nanosheet, and the nano-graphite sheet may be less than or equal to 10 nanometers.

When the flake graphite particles include the expanded graphite sheet, a thickness of the expanded graphite sheet may be greater than or equal to 100 nanometers.

It should be noted that, chemical functional groups are grafted on surfaces of the flake graphite particles, and a type of the chemical functional groups may be —OH, —COOH, —SO$_3$H, —NH$_2$, —SH, or the like. When the flake graphite particles are dispersed in water or an organic solvent, the chemical functional groups located on the surfaces of the flake graphite particles help form a covalent bond between two flake graphite particles. It should be noted that, the type of the chemical functional groups grafted on the surfaces of the flake graphite particles is determined by the solvent in which the flake graphite particles are dispersed. Usually, different solvents correspond to different types of chemical functional groups. For example, when the organic solvent is epoxy resin, the chemical functional groups grafted on the surfaces of the flake graphite particles may be —NH$_2$.

It should be noted that, a mass percentage of the flake graphite particles in the mixture may be greater than or equal to 1% and less than or equal to 90%. Further, a mass percentage of the flake graphite particles in the mixture may alternatively be greater than or equal to 3% and less than or equal to 70%.

It should be noted that, when the mass percentage of the flake graphite particles in the mixture exceeds a threshold, a liquid crystal-like self alignment ability occurs in the mixture. That the liquid crystal-like self alignment ability occurs in the mixture helps increase a consistency of orientations of flake graphite particles in a graphite thin film, and increases closeness between the orientations of the flake graphite particles in the graphite thin film and a direction of a plane in which a finally formed heat sink lies. The graphite thin film is formed through coating in block S13. To enable the liquid crystal-like self alignment ability to occur, usually, the mass percentage of the flake graphite particles in the mixture should be greater than or equal to 15%.

It should be noted that, when the solvent is water, a proper amount of active liquid should be added to the water, and the active liquid is used for enabling a covalent bond to be formed between adjacent flake graphite particles. The active liquid may be a surface active agent, or the like. It should be noted that, when the solvent is water, the water is deionized water.

Further, when the solvent is an organic solvent, the organic solvent may be ethanol, or may be epoxy resin.

S13: Coat a base material with the mixture, to form a wet film.

The base material may be a high temperature resistant ceramic plate, graphite, or the like.

It should be noted that, a thickness of the wet film is usually greater than a thickness of the finally formed heat sink. Specifically, viscosity (usually the viscosity should be at least $10^5$ Cps, and even up to $10^6$ Cps) and thixotropy of the mixture is controlled, so that even if the thickness of the wet film reaches a millimeter scale, an apparent vertical flowing or collapse phenomenon does not occur in the wet film.

It should be noted that, the wet film is paste or gel-like.

S15: Perform heat treatment on the wet film, to obtain the heat sink in Embodiment 1.

For a related limitation on and a beneficial effect of the heat sink, refer to Embodiment 1, and details are not described herein again.

In another embodiment of this application, after block S15, the preparation method for a heat sink may further include the following block:

S17: Perform compaction treatment on the heat sink, to obtain the heat sink whose density is in a range of 0.8/cm$^3$ to 2.2 g/cm$^3$.

The density of the heat sink obtained after the heat treatment is on the low side, and therefore a pressure perpendicular to the direction of the plane in which the heat sink lies is applied to the heat sink, to perform compaction treatment on the heat sink, to improve the density of the heat sink. In addition, due to the compaction treatment, an orientation of a flake graphite particle located in the heat sink is closer to the direction of the plane in which the heat sink lies.

It should be noted that, a larger density of the heat sink indicates a larger coefficient of thermal conductivity of the plane of the heat sink. After the foregoing press treatment, the density of the heat sink may be greater than or equal to 1.2 g/cm$^3$ and less than or equal to 2.2 g/cm$^3$. However, usually, after the press treatment, the density of the heat sink does not reach the highest. For example, the density of the heat sink is greater than or equal to 1.2 g /cm$^3$ and less than or equal to 2.0 g/cm$^3$. This is because the heat sink whose density is greater than or equal to 1.2 g/cm³ and less than or equal to 2.0 g/cm³ has compressibility, thereby having a tolerance capability.

In still another embodiment of this application, the pressure applied to the heat sink in block S17 is evenly transmitted in the heat sink, and therefore the density of the heat sink should be evenly distributed. From the microscopic perspective, distribution of the flake graphite particles of the heat sink is not absolutely even, and densities of flake graphite particles in some areas may be different from densities of flake graphite particles in some other areas. However, from the overall perspective, the density of the heat sink is relatively evenly distributed.

In yet another embodiment of this application, different heat dissipation areas in the heat sink have different densities. For a concept of a heat dissipation area, refer to Embodiment 2. To implement that different heat dissipation areas have different densities, a press head used for compacting different sub-surfaces may be manufactured by using flexible materials having different hardness.

Figure 8:
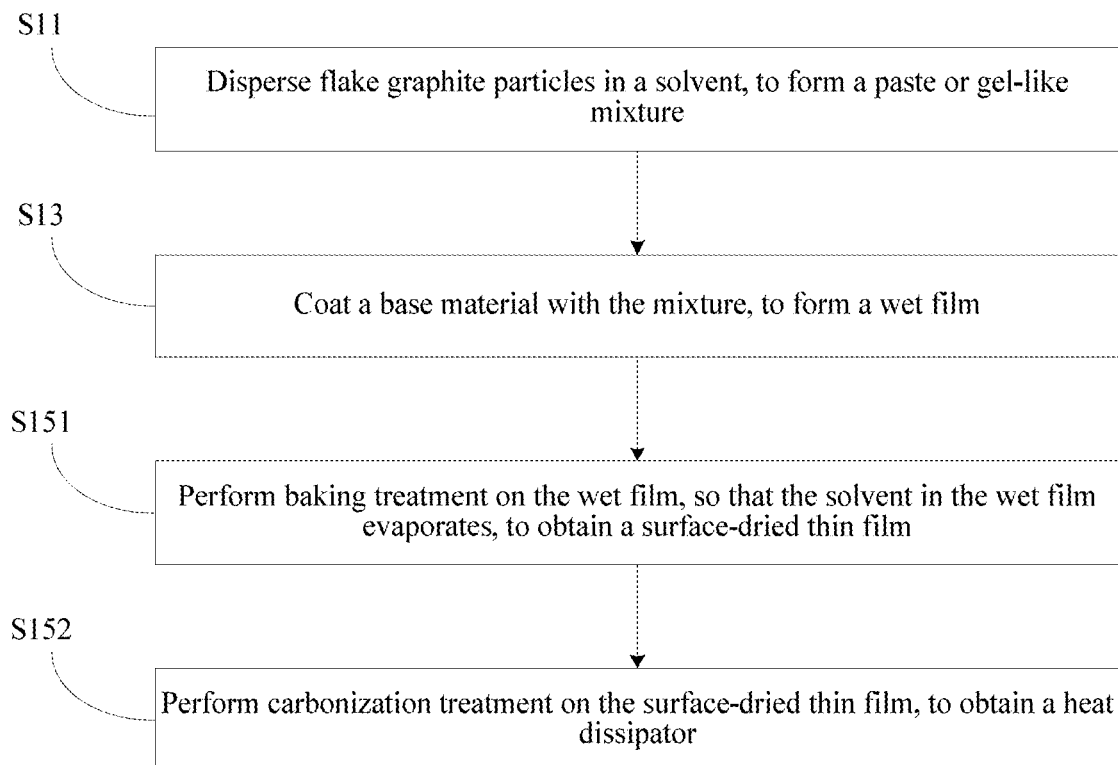
FIG. 8 is a schematic flowchart of another preparation method for a heat sink according to an embodiment of this disclosure.

In yet another embodiment of this application, referring to FIG. 8, block S15 includes at least the following blocks.

S151: Perform baking treatment on the wet film, so that the solvent in the wet film evaporates, to obtain a surface-dried thin film.

Different solvents correspond to different heat treatment temperatures. For example, heat treatment temperatures corresponding to the water and the organic solvent are different. Usually, the heat treatment temperatures are greater than or equal to 100 degrees and less than or equal to 500 degrees.

S152: Perform carbonization treatment on the surface-dried thin film, to obtain the heat sink in Embodiment 1.

A purpose of the carbonization treatment is to remove a non-carbon element such as H, O, S, or N in the surface-dried thin film, to obtain a carbonized thin film. Compared with the surface-dried thin film, the carbonized thin film has a better heat conduction capability. It should be noted that, the surface-dried thin film manufactured by using different solvents corresponds to different temperatures when carbonization temperature treatment is performed. Usually, the carbonization temperatures are greater than or equal to 150 degrees and less than or equal to 1200 degrees.

Figure 9:
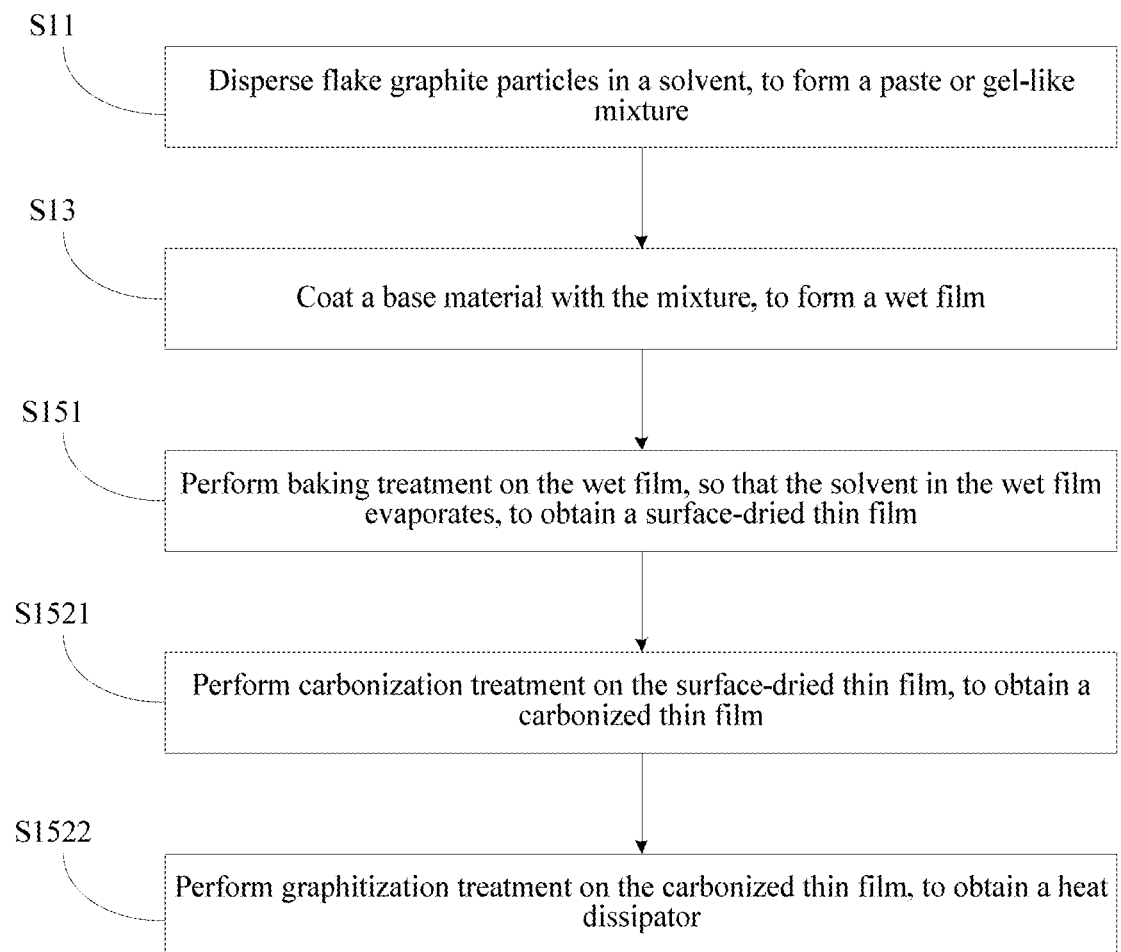
FIG. 9 is a schematic flowchart of still another preparation method for a heat sink according to an embodiment of this disclosure.

In yet another embodiment of this application, referring to FIG. 9, block S152 may further include the following blocks.

S1521: Perform carbonization treatment on the surface-dried thin film, to obtain a carbonized thin film.

A purpose of the "performing carbonization treatment on the surface-dried thin film" in block S1521 is the same as a purpose of the "performing carbonization treatment on the surface-dried thin film" in block S152, and temperatures for performing carbonization treatment in block S1521 and block S152 are also the same. Therefore, for a related limitation on the carbonization treatment in block S1521, refer to a related limitation on the carbonization treatment in block S152.

S1522: Perform graphitization treatment on the carbonized thin film, to obtain the heat sink in Embodiment 1.

To achieve a larger coefficient of thermal conductivity, graphitization treatment with a higher temperature should be performed on the carbonized thin film, to enable a carbon mesh plane in the carbonized thin film to further grow, thereby transforming an agraphitic carbon layer into a graphite crystal structure. It should be noted that, a temperature used for performing the graphitization treatment is at least 1500 degrees, and when the temperature is higher, the graphitized thin film has a higher degree of graphitization, so that heat conduction performance of the graphitized thin film is better.

It should be noted that, a degree of graphitization of the heat sink should be greater than or equal to 50%. Alternatively, a degree of graphitization of the heat sink may be greater than or equal to 80%.

In a first implementation of this embodiment of this application, the heat sink may be manufactured by using the following blocks.

S21: Mix and evenly blend a 20 g oxidized graphene nanosheet, a 400 g nano-graphite sheet, 1 L deionized water, a surface active agent, and the like, to prepare a paste mixture, where a mass percentage of the surface active agent to the deionized water is 0.1%.

Specifically, an average thickness of the oxidized graphene nanosheet is in a range of 2 nanometers to 3 nanometers, a maximum length of the oxidized graphene nanosheet is in a range of 5 microns to 10 microns, and in the oxidized graphene nanosheet, a mass percentage of the oxygen element to the oxidized graphene nanosheet is in a range of 20% to 40%. An average thickness of the nano-graphite sheet is in a range of 50 nanometers to 100 nanometers, a maximum length of the nano-graphite sheet is in a range of 5 microns to 15 microns, and in the nano-graphite sheet, a mass percentage of the oxygen element to the nano-graphite sheet is less than or equal to 2%.

S23: Coat a high temperature resistant ceramic plate or graphite with the paste mixture by using a blade coating method, to form a wet film whose average thickness is 0.1 millimeter.

S24: Perform baking treatment on the wet film formed through the coating, to form a surface-dried thin film, where a temperature for the baking treatment is in a range of 100° C. to 200° C.

S25: Place the surface-dried thin film in a high temperature furnace, increase a heating temperature to a range of 400° C. to 700° C., and heat the high temperature furnace for approximately eight hours, to perform high-temperature carbonization treatment on the surface-dried thin film, to obtain a carbonized thin film, where vacuum pumping treatment has been performed on the high temperature furnace, and nitrogen has been filled into the high temperature furnace after the vacuum pumping.

S26: Increase the heating temperature to a range of 1500° C. to 2000° C., and heat the high temperature furnace for approximately four hours, to perform graphitization treatment on the carbonized thin film, to obtain the heat sink.

S27: Perform compaction treatment on the heat sink by using a hydraulic press, to obtain the heat sink on which the compaction treatment has been performed and whose density is approximately 2 g/cm³ and average thickness is approximately 70 microns.

A coefficient of plane thermal conductivity of the heat sink on which the compaction treatment has been performed is tested by using a Laser Flash method, and a test result indicates that the coefficient of plane thermal conductivity of the heat sink on which the compaction treatment has been performed may reach 720 watts/meter•degree Kelvin, where the unit "watt/meter•degree Kelvin" may be "W/MK" for short.

It should be noted that, if the heating temperature in block S26 is changed to 3000° C., the coefficient of plane thermal conductivity of the heat sink on which the compaction treatment has been performed may reach 900 W/MK It should be noted that, before the nano-graphite sheet mentioned in block S21 is mixed and the paste mixture is formed, if Plasma treatment is performed on the nano-graphite sheet, the viscosity of the paste mixture is found to be significantly reduced. The coefficient of plane thermal conductivity of the heat sink on which the compaction treatment has been performed and that is manufactured based on the method described in the first implementation and by using the nano-graphite sheet on which the plasma treatment has been performed may reach 800 W/MK.

A metal frame that is adhered to a an actual smartphone and whose average thickness of a heat dissipation area corresponding to a circuit board is 100 um and average thickness of a heat dissipation area corresponding to a battery area is 25 um is manufactured by using the foregoing materials and technique.

In a second implementation of this embodiment of this application, the heat sink may be manufactured by using the following blocks.

S31: Mix and evenly blend a 20 g oxidized graphene nanosheet, a 100 g chemically modified nano-graphene sheet, a 200 g nano-graphite sheet, 0.8 L deionized water, 1.2 L ethanol, a surface active agent, and the like, to prepare a paste mixture, where a mass percentage of the surface active agent to a solvent is 0.2%, and the solvent is a mixture of the 0.8 L deionized water and the 1.2 L ethanol.

A limitation on the oxidized graphene nanosheet in the second implementation is the same as the limitation on the oxidized graphene nanosheet in the foregoing first implementation, and a limitation on the nano-graphite sheet in the second implementation is also the same as the limitation on the nano-graphite sheet in the first implementation. Details for both are not described herein again.

It should be noted that, the chemically modified nano-graphene sheet is a nano-graphene sheet whose surface has a chemical functional group or an active functional group. An average thickness of the chemically modified nano-graphene sheet is 1 nanometer, a maximum length of the chemically modified nano-graphite sheet is in a range of 8 microns to 15 microns, and in the chemically modified nano-graphite sheet, a mass percentage of the oxygen element to the chemically modified nano-graphite sheet is greater than or equal to 4%.

After block S31, the method further includes blocks S33, S34, S35, S36, and S37, and an execution sequence of S33, S34, S35, S36, and S37 is S33→S34→S35→S36→S37.

Block S33 is the same as the foregoing block S23. Block S35 is the same as the foregoing block S25. A difference between block S34 and block S24 is only that the temperature for the baking treatment in block S34 is 120° C. A difference between block S36 and the foregoing block S26 is only that the temperature for the graphitization treatment in block S36 is in a range of 2800° C. to 3200° C. A difference between block S37 and the foregoing block S27 is that the average thickness of the heat sink on which the compaction treatment has been performed and that is obtained in block S37 is approximately 50 microns. Therefore, for block S33, S34, S35, S36, and S37, details are not described herein again.

A coefficient of plane thermal conductivity of the heat sink on which the compaction treatment has been performed is tested by using a Laser Flash method, and a test result indicates that the coefficient of plane thermal conductivity of the heat sink on which the compaction treatment has been performed may reach 1200 W/MK.

In a third implementation of this embodiment of this application, the heat sink may be manufactured by using the following blocks.

S41: Mix and evenly blend a 20 g oxidized graphene nanosheet, a 100 g chemically modified nano-graphene sheet, a 150 g nano-graphite sheet, a 50 g expanded graphite sheet, 0.8 L deionized water, 1.2 L ethanol, a surface active agent, and the like, to prepare a paste mixture, where a mass percentage of the surface active agent to a solvent is 0.2%, and the solvent is a mixture of the 0.8 L deionized water and the 1.2 L ethanol.

A limitation on the oxidized graphene nanosheet in the third implementation is the same as the limitation on the oxidized graphene nanosheet in the foregoing first implementation, and a limitation on the nano-graphite sheet in the third implementation is also the same as the limitation on the nano-graphite sheet in the first implementation. Details for both are not described herein again. In addition, a limitation on the chemically modified nano-graphene sheet in the third implementation is the same as the limitation on the chemically modified nano-graphene sheet in the foregoing second implementation, and details are also not described herein again.

It should be noted that, a maximum length of the expanded graphite sheet is approximately 5 microns.

Block S43 is the same as the foregoing block S23. Block S45 is the same as the foregoing block S25. A difference between block S44 and block S24 is only that the temperature for the baking treatment in block S44 is 120° C. A difference between block S46 and the foregoing block S26 is only that the temperature for the graphitization treatment in block S46 is in a range of 2800° C. to 3200° C. A difference between block S47 and the foregoing block S27 is that the density of the heat sink on which the compaction treatment has been performed and that is obtained in block S47 is approximately 1.5 g/cm$^3$, and the average thickness is approximately 130 microns. Therefore, for block S43, S44, S45, S46, and S47, details are not described herein again.

A coefficient of plane thermal conductivity of the heat sink on which the compaction treatment has been performed is tested by using a Laser Flash method, and a test result indicates that the coefficient of plane thermal conductivity of the heat sink on which the compaction treatment has been performed may reach 800 W/MK. The heat sink on which the compaction treatment has been performed has compressibility, and can be compressed by 30%. After the heat sink on which the compaction treatment has been performed is further compressed, the coefficient of plane thermal conductivity of the heat sink on which the compaction treatment has been performed may be increased to 1000 W/MK. The heat sink on which the compaction treatment has been performed has the compressibility, and therefore can offset an assembly tolerance, so that a heat dissipation effect of the heat sink can be further improved in an actual application. However, it should be pointed out that, such compressibility is implemented by mainly relying on a relatively low density, and after being compressed, the heat sink has relatively poor rebound resilience.

It should be noted that, the heat sink in any one of the foregoing embodiments may be further cut into a shape such as an L shape, a U shape, or a Z shape, to adapt to different scenario requirements.

It should understood that, the terms "first" and "second" in descriptions of this application are merely intended for a purpose of description, and shall not be understood as an indication or implication of relative importance or implicit indication of the number of indicated technical features. Therefore, a feature limited by "first" or "second" may explicitly or implicitly include one or more features. In the descriptions of this application, unless otherwise described, "a plurality of" means two or more.

In the descriptions of this specification, the described specific features, structures, materials, or characteristics may be combined in a proper manner in any one or more of the embodiments or examples.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A heat sink, comprising:
a first surface and a second surface opposite to the first surface, wherein the second surface comprises a plurality of sub-surfaces, and each sub-surface is configured to be in contact with a surface of a heat emitting element;
the plurality of sub-surfaces comprise a first sub-surface, and a thickness between the first sub-surface and the first surface is less than a thickness between the first surface and each of the plurality of sub-surfaces except the first sub-surface; and
the heat sink comprises a plurality of layers of a graphene sheets, each layer of a graphene sheet comprises a plurality of flake graphite particles, and two adjacent flake graphite particles located in a same layer of a graphene sheet are covalently bonded.

2. The heat sink of claim 1, wherein the first surface is planar, and a direction of the thickness between each sub-surface and the first surface is perpendicular to a plane in which the first surface lies.

3. The heat sink of claim 2, wherein the plurality of layers of graphene sheets are stacked layer by layer along a direction perpendicular to the first surface.

4. The heat sink of claim 1, wherein the plurality of sub-surfaces further comprise a second sub-surface, and a thickness between the second sub-surface and the first surface is greater than a thickness between the first surface and each of the plurality of sub-surfaces except the second sub-surface.

5. The heat sink of claim 1, wherein two adjacent layers of graphene sheets are bonded by a van der Waals force.

6. The heat sink of claim 1, wherein the flake graphite particles comprise one or more of a graphene nanosheet, a nano-graphite sheet, or an expanded graphite sheet.

7. A communications device, comprising:
a metal frame;
a plurality of heat emitting elements; and
a heat sink, wherein a quantity of the plurality of heat emitting elements is the same as a quantity of the plurality of sub-surfaces, each sub-surface is in contact with one heat emitting element, and the first surface is in contact with a surface of the metal frame;
the heat sink comprises a first surface and a second surface opposite to the first surface, wherein the second surface comprises a plurality of sub-surfaces, and each sub-surface is configured to be in contact with a surface of a heat emitting element;
the plurality of sub-surfaces comprise a first sub-surface, and a thickness between the first sub-surface and the first surface is less than a thickness between the first surface and each of the plurality of sub-surfaces except the first sub-surface; and
the heat sink comprises a plurality of layers of graphene sheets, each layer of graphene sheet comprises a plurality of flake graphite particles, and two adjacent flake graphite particles located in a same layer of a graphene sheet are covalently bonded.

8. The communications device of claim 7, wherein an insulation layer is adhered to the second surface.

9. The communications device of claim 7, wherein the plurality of heat emitting elements comprise at least one first heat emitting element, a quantity of the at least one first heat emitting element is the same as a quantity of the at least one first sub-surface, and each first sub-surface is in contact with one first heat emitting element; and
power consumption of the first heat emitting element is less than power consumption of each of the plurality of heat emitting elements except the first heat emitting element.

10. The communications device of claim 7, wherein the plurality of heat emitting elements further comprise at least one second heat emitting element, a quantity of the at least one second heat emitting element is the same as a quantity of the at least one second sub-surface, and each second sub-surface is in contact with one second heat emitting element; and
power consumption of the second heat emitting element is greater than power consumption of each of the plurality of heat emitting elements except the second heat emitting element.

11. A method of preparing a heat sink, comprising:
dispersing flake graphite particles in a solvent, to form a paste or gel-like mixture, wherein the solvent is water or an organic solvent;
coating a base material with the mixture, to form a wet film; and
performing heat treatment on the wet film, to obtain a heat sink;
wherein the heat sink comprises a first surface and a second surface opposite to the first surface, wherein the second surface comprises a plurality of sub-surfaces, and each sub-surface is configured to be in contact with a surface of a heat emitting element;
the plurality of sub-surfaces comprise a first sub-surface, and a thickness between the first sub-surface and the first surface is less than a thickness between the first surface and each of the plurality of sub-surfaces except the first sub-surface; and
the heat sink comprises a plurality of layers of graphene sheets, each layer of a graphene sheet comprises a plurality of flake graphite particles, and two adjacent flake graphite particles located in a same layer of a graphene sheet are covalently bonded.

12. The method of claim 11, wherein performing the heat treatment on the wet film comprises:
performing baking treatment on the wet film, so that the solvent in the wet film evaporates, to obtain a surface-dried thin film; and
performing a carbonization treatment on the surface-dried thin film, to obtain the heat sink.

13. The method of claim 12, wherein performing the carbonization treatment on the surface-dried thin film comprises:
performing the carbonization treatment on the surface-dried thin film, to obtain a carbonized thin film; and
performing a graphitization treatment on the carbonized thin film.

14. The method of claim 11, further comprising:
performing a compaction treatment on the heat sink, to obtain a compacted heat sink, wherein a density of the compacted heat sink is in a range of 0.8 g/cm$^3$ to 2.2 g/cm$^3$.

15. The method of claim 11, wherein the mixture has a liquid crystal-like self alignment ability.

16. The method of claim 11, wherein chemical functional groups are grafted on surfaces of the flake graphite particles.

17. The method of claim 11, wherein when the solvent comprises water, an active liquid is added to the water.

18. The method of claim 11, wherein the flake graphite particles comprise one or more of a graphene nanosheet, an oxidized graphene nanosheet, a nano-graphite sheet, or an expanded graphite sheet.

* * * * *